US008860071B2

(12) United States Patent
Otremba

(10) Patent No.: US 8,860,071 B2
(45) Date of Patent: Oct. 14, 2014

(54) ELECTRO-THERMAL COOLING DEVICES AND METHODS OF FABRICATION THEREOF

(75) Inventor: Ralf Otremba, Kaufbeuren (DE)

(73) Assignee: Infineon Technologies AG, Neubiberg (DE)

( * ) Notice: Subject to any disclaimer, the term of this patent is extended or adjusted under 35 U.S.C. 154(b) by 148 days.

(21) Appl. No.: 13/529,885

(22) Filed: Jun. 21, 2012

(65) Prior Publication Data

US 2013/0341777 A1    Dec. 26, 2013

(51) Int. Cl.
*H01L 33/62*    (2010.01)
*H01L 33/52*    (2010.01)

(52) U.S. Cl.
USPC ............ 257/99; 257/666; 257/675; 257/676; 257/678; 257/E21.506; 257/E23.051; 257/E23.052; 438/113; 438/122; 438/123

(58) Field of Classification Search
CPC ............................................... H01L 23/49575
USPC ................. 257/675, 676, E21.506, E23.051, 257/E23.502, 99, 666; 438/111, 112, 123, 438/124
See application file for complete search history.

(56) References Cited

U.S. PATENT DOCUMENTS

| 8,077,475 | B2 | 12/2011 | Otremba |
| 8,098,499 | B2 | 1/2012 | Otremba |
| 2006/0169976 | A1* | 8/2006 | Kameda et al. ................. 257/44 |
| 2007/0090496 | A1* | 4/2007 | Otremba ...................... 257/666 |
| 2009/0083963 | A1 | 4/2009 | Otremba |
| 2011/0180837 | A1* | 7/2011 | Koller ............................ 257/99 |
| 2012/0027928 | A1 | 2/2012 | Otremba |
| 2013/0075884 | A1* | 3/2013 | Gong et al. .................. 257/676 |

FOREIGN PATENT DOCUMENTS

DE    102008046728 A1    5/2009

OTHER PUBLICATIONS

Ulinski, "Organic Diode and Other Circuit Element Creation Through Variations of Poly (3,4-Ethylenedioxythiophene) Synthesis," Thesis, University of Pittsburgh, School of Engineering, Copyright by Daniel James Ulinski 2004, 124 pages.

* cited by examiner

*Primary Examiner* — Dao H Nguyen
(74) *Attorney, Agent, or Firm* — Slater & Matsil, L.L.P.

(57) ABSTRACT

In one embodiment, a semiconductor module includes a leadframe having a first side and an opposite second side. A semiconductor chip is disposed over the first side of the leadframe. A switching element is disposed under the second side of the leadframe. In another embodiment, a method of forming a semiconductor module includes providing a semiconductor device having a leadframe. A semiconductor chip is disposed over a first side of the leadframe. A switching element is attached at an opposite second side of the leadframe.

30 Claims, 17 Drawing Sheets

ELECTRO-THERMAL COOLING DEVICES AND METHODS OF FABRICATION THEREOF

TECHNICAL FIELD

The present invention relates generally to electronic devices, and more particularly to electro-thermal cooling devices and methods of fabrication thereof.

BACKGROUND

Semiconductor devices are used in a variety of electronic and other applications. Semiconductor devices comprise integrated circuits or discrete devices that are formed on semiconductor wafers by depositing one or more types of thin films of material over the semiconductor wafers, and patterning the thin films of material to form the integrated circuits.

The semiconductor devices are typically packaged within a ceramic or a plastic body to protect the semiconductor devices from physical damage or corrosion. The packaging also supports the electrical contacts required to connect a semiconductor device, also referred to as a die or a chip, to other devices external to the packaging.

Many different types of packaging are available depending on the type of semiconductor device and the intended use of the semiconductor device being packaged. Typical packaging features, such as dimensions of the package, pin count, etc., may comply with open standards from Joint Electron Devices Engineering Council (JEDEC), among others. Packaging may also be referred as semiconductor device assembly or simply assembly.

Packaging also supports the thermal cooling requirements of the devices. Conventional packaging may not provide sufficient thermal protection when the semiconductor devices generate large amounts of heat.

SUMMARY OF THE INVENTION

In accordance with an embodiment of the present invention, a semiconductor module includes a leadframe having a first side and an opposite second side. A semiconductor chip is disposed over the first side of the leadframe. A switching element is disposed under the second side of the leadframe.

In accordance with an embodiment of the present invention, a semiconductor module comprises a first discrete semiconductor device including a first lead and a second lead. The semiconductor module further comprises a first switching element having a first terminal and a second terminal. The first terminal of the first switching element is electrically and thermally coupled to the first discrete semiconductor device. The first switching element is configured to conduct heat away from the first discrete semiconductor device.

In another embodiment, a method of forming a semiconductor module includes providing a semiconductor device having a leadframe. A semiconductor chip is disposed over a first side of the leadframe. A switching element is attached at an opposite second side of the leadframe.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1A-1C, illustrates a conventional semiconductor device, wherein FIG. 1A illustrates a projection view, wherein FIG. 1B illustrates a cross-sectional side view of the semiconductor device, and wherein FIG. 1C illustrates a magnified cross-sectional view of the semiconductor device;

FIG. 2, which includes FIGS. 2A-2D, illustrates a semiconductor device in accordance with an embodiment of the invention, wherein FIG. 2A illustrates a projection view, wherein FIG. 2B illustrates a cross-sectional side view of the semiconductor device, wherein FIG. 2C illustrates a top view of the semiconductor device, and wherein FIG. 2D illustrates a magnified cross-sectional side view of the semiconductor device;

FIG. 3, which includes

FIG. 4, which includes

FIG. 5, which includes

FIG. 6, which includes

FIG. 7, which includes

FIG. 8, which includes

FIG. 10, which includes FIG. 11, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of contexts. The embodiments discussed are merely illustrative of one way to make and use the invention, and do not limit the scope of the invention.

Power semiconductor dies have special requirements (e.g., due to the high voltages and high heat generation) and require good thermal management. Consequently, packages for power semiconductor devices have enhanced performance requirements while being very sensitive to production costs. As will be described below, various embodiments of the present invention enable formation of packages for power semiconductor packages with improved performance without significantly increasing costs.

Figure 1A:
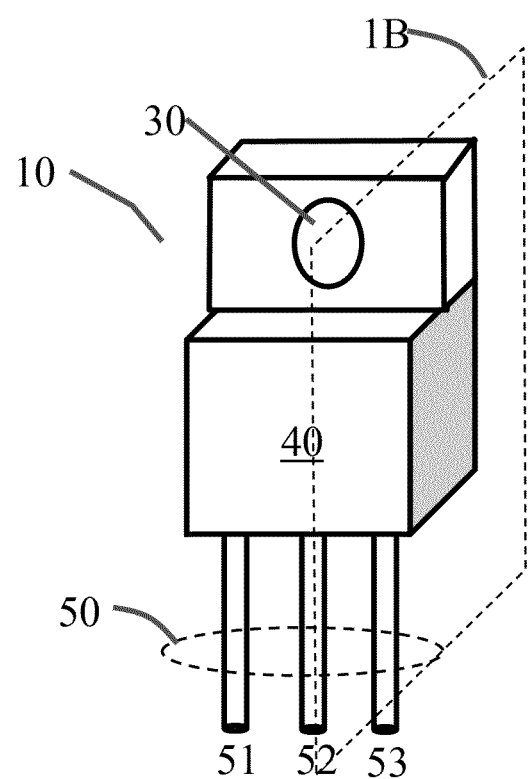
Figure 1B:
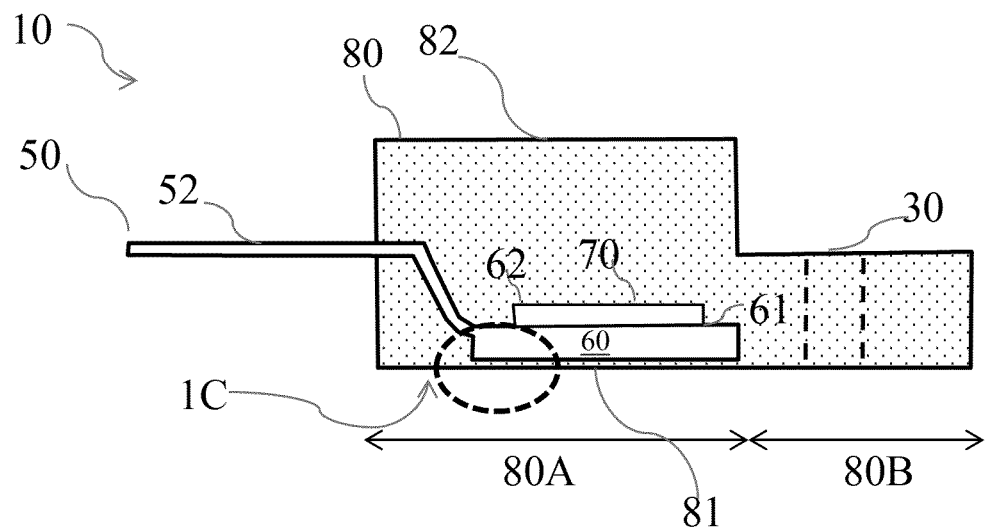
Figure 1C:
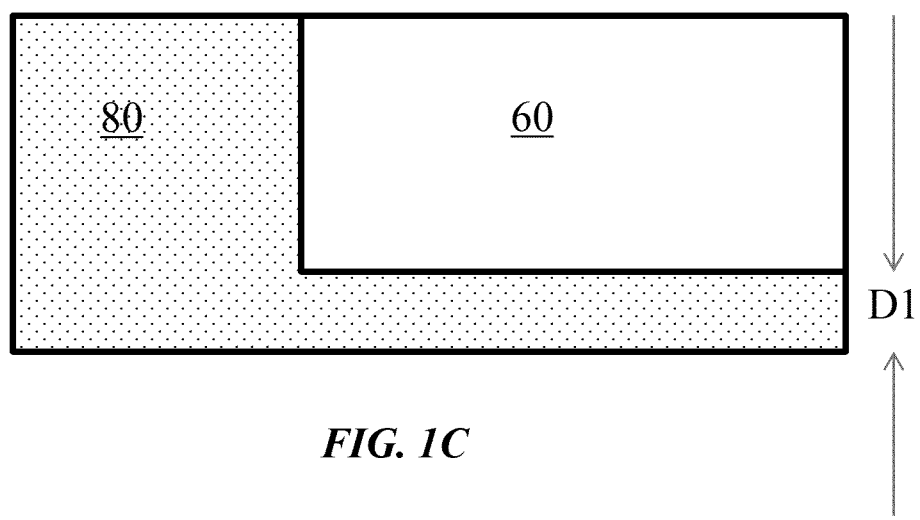

FIG. 1, which includes FIGS. 1A-1C, illustrates a conventional semiconductor device, wherein FIG. 1A illustrates a projection view, wherein FIG. 1B illustrates a cross-sectional side view of the semiconductor device, and wherein FIG. 1C illustrates a magnified cross-sectional view of the semiconductor device.

The semiconductor device 10 includes a package 40 having a plurality of leads 50 or pins extending out of the body of the package 40 along one side of the package. The plurality of leads 50 may comprise a number of leads in various embodiments depending on the package type. In one embodiment, the plurality of leads 50 comprises a gate/base lead 51, a drain/collector lead 52, and a source/emitter lead 53. The package 40 includes an opening 30 for securely mounting a heatsink underneath the package 40.

Referring to FIG. 1B, which is a sectional view of FIG. 1A, the semiconductor device 10 comprises a leadframe 60 disposed within a encapsulant 80. The leadframe 60 includes the plurality of leads 50. A first semiconductor chip 70 is disposed over a die attach or die paddle of the leadframe 60. The leadframe 60 couples to a first contact region disposed on a first side 61 of the first semiconductor chip 70. The opposite second side 62 of the first semiconductor chip 70 is covered with an encapsulant.

The encapsulant 80 has a first portion 80A and a second portion 80B. The first portion 80A is directly over the first semiconductor chip 70 while the second portion 80B is laterally adjacent the first semiconductor chip 70. The second portion 80B is directly away from the direction of the plurality of leads 50 such that the first semiconductor chip 70 is disposed between the plurality of leads 50 and the second portion 80B. As illustrated, the first portion 80A is thicker than the second portion 80B. An opening 30 is disposed within the encapsulant 80. The opening 30 is configured to enable mounting of a heatsink. For example, a heatsink may be attached to the semiconductor device 10 using a screw mounted through the opening 30.

Referring again to FIG. 1B, the encapsulant 80 includes a first major surface 81 for the first portion 80A and the second portion 80B, for example, for mounting a heatsink. The first major surface 81 is planar to maximize heat dissipation from the first semiconductor chip 70 to the heatsink. The first portion 80A of the encapsulant 80 includes a second major surface 82 disposed over the second side 62 of the first semiconductor chip 70.

As illustrated in the magnified cross-sectional view of FIG. 1C, a thin portion of the encapsulant 80 is disposed under the leadframe 60. As the second major surface 82 of the encapsulant 80 is mounted tightly with the heatsink, the thin portion of the encapsulant 80 serves as a thermal conductor while providing electrical isolation between the heatsink and the leadframe 60. However, even thin layers of the encapsulant 80 have high thermal resistance. For example, the first thickness D1 of the encapsulant 80 has a strong correlation with the efficiency of removing thermal energy from the first semiconductor chip 70. Consequently, this may result in poor heat extraction from the semiconductor devices degrading the semiconductor devices. Further, the high sensitivity to the first thickness D1 of the encapsulant 80 may result in large variations in heat extraction efficiency between different packages due to process variations.

A structural embodiment of the invention will be described using FIG. 2. Embodiments of electrical equivalent circuit diagrams of the semiconductor devices will be described using FIG. 3. Further structural embodiments of the invention will be described using FIGS. 4-8. An illustrative converter circuit applying embodiments of the invention will be described using FIG. 9. Embodiments of methods of fabricating the semiconductor device will be described using FIGS. 10 and 11.

Figure 2A:
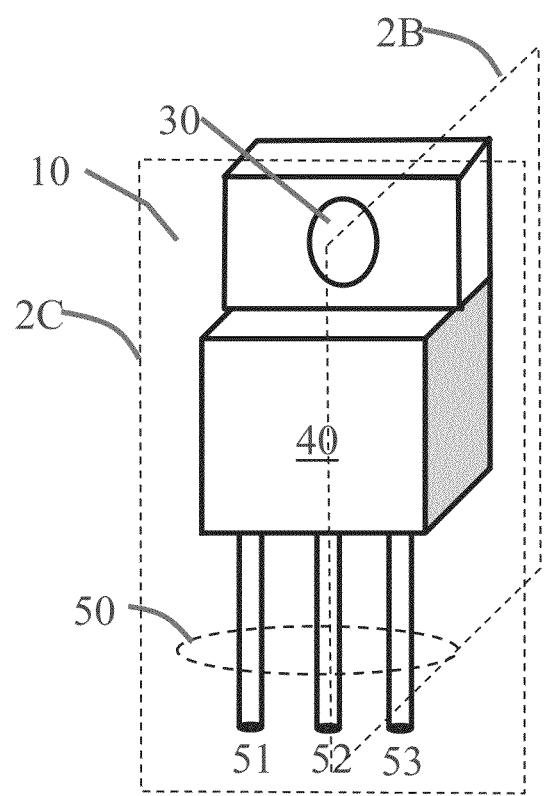
Figure 2B:
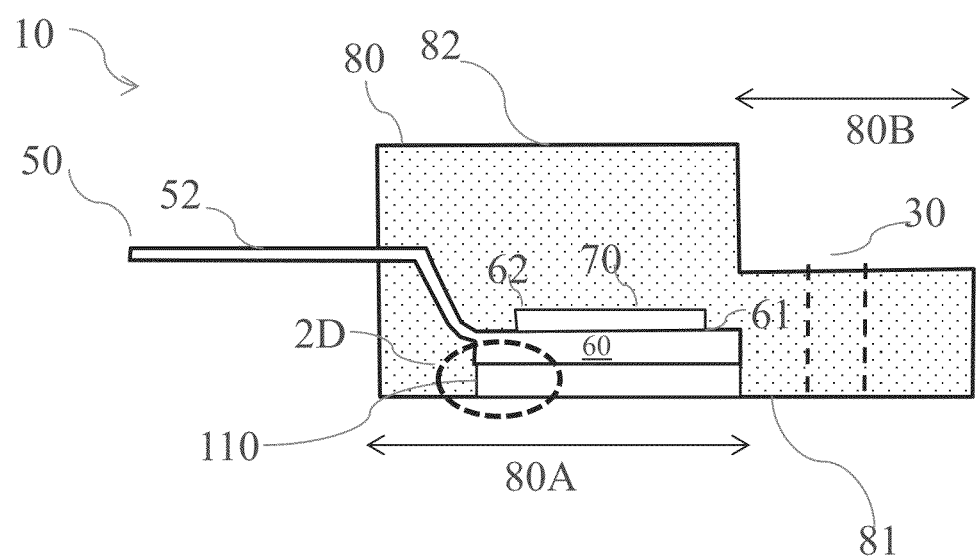
Figure 2C:
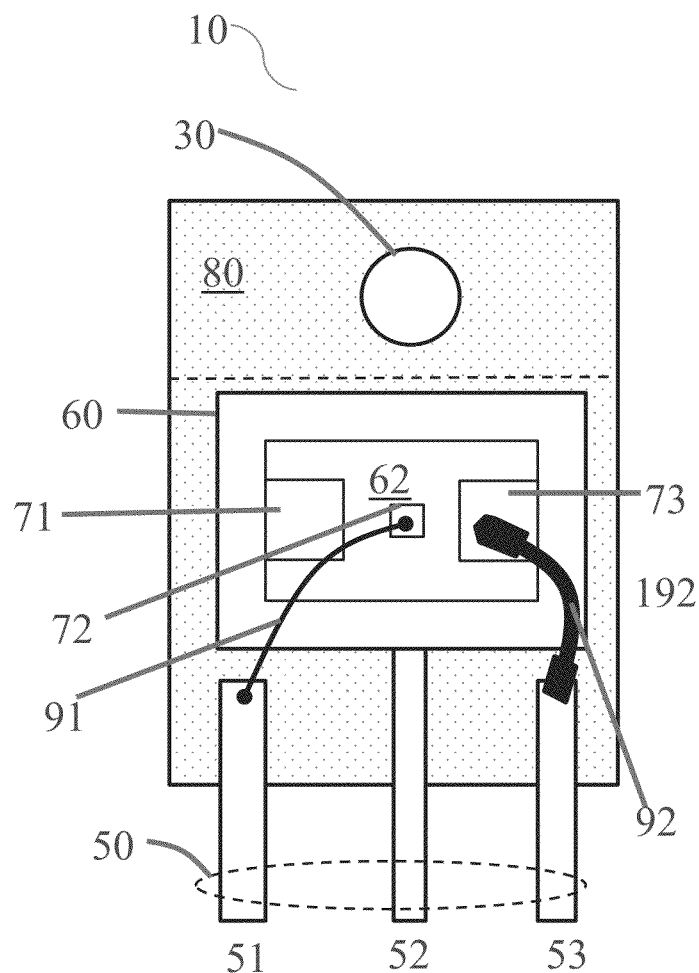
Figure 2D:
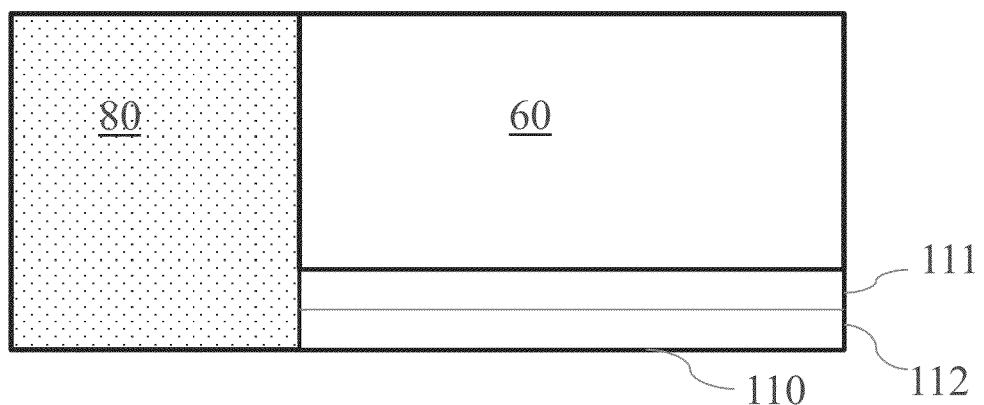

FIG. 2, which includes FIGS. 2A-2D, illustrates a semiconductor device in accordance with an embodiment of the invention, wherein FIG. 2A illustrates a projection view, wherein FIG. 2B illustrates a cross-sectional side view of the semiconductor device, wherein FIG. 2C illustrates a top view of the semiconductor device, and wherein FIG. 2D illustrates a magnified cross-sectional side view of the semiconductor device.

Embodiments of the invention provide electrical isolation without compromising thermal efficiency. Various embodiments of the invention include a switch that changes thermal and/or electrical conductivity.

FIG. 2A illustrates the projection view of the semiconductor device 10, which may be compliant with protocols of standard packages. In one embodiment, the projection view of the semiconductor device 10 may be similar to FIG. 1.

FIG. 2B illustrates a first semiconductor chip 70 attached to a leadframe 60 having a plurality of leads 50. Referring to FIG. 2B, in various embodiments, an switching element 110 is disposed under the leadframe 60. The switching element 110 allows thermal conduction when heat is being generated at the first semiconductor chip 70. However, the switching element 110 electrically isolates the leadframe 60 from the potential on a heatsink attached to the first major surface 81 of the encapsulant 80.

As illustrated, the switching element 110 contacts a bottom surface of the leadframe 60. Further, the switching element 110 has a foot print (area) similar to the die paddle of the leadframe 60 to which the electro-thermal switch is attached. This maximizes the thermal efficiency of heat removal from the first semiconductor chip 70.

The switching element 110 may comprise any suitable type of thermoelectric device in various embodiments. In one or more embodiments, the switching element 110 comprises a diode. In one embodiment, the switching element 110 comprises an inorganic semiconductor diode such as a silicon p/n junction diode.

In another embodiment, the switching element 110 may comprise a diode formed from a carbon based material. In one embodiment, the organic diode may comprise polymer materials, which may operate using electrochemical reactions such as redox reactions. The electrochemical reactions may result in current flow through the polymer material, making the polymer conductive. Examples of carbon based material diodes may include materials fabricated using polyacetylene, ethylenedioxythiophene, carbon nanotubes, graphene, and others.

In some embodiments, the switching element 110 may comprise a diode based on organic semiconductor materials and inorganic semiconductor materials. Embodiments of the invention may also include electro-thermal switches based on three terminal semiconductor devices. In another embodiment, the switching element 110 comprises a heat pump, for example, a Peltier device based on the Peltier effect.

In one or more embodiments, the switching element 110 is substantially coplanar with the first major surface 81 of the encapsulant 80. This ensures good contact with the heatsink, which is necessary to maximize the thermal efficiency.

In various embodiments, the first semiconductor chip 70 may be a power semiconductor device, which may be a discrete device in one embodiment. In one embodiment, the first semiconductor chip 70 is a three terminal device such as a power metal insulator semiconductor field effect transistor (MISFET), a junction field effect transistor (JFET), bipolar junction transistor (BJT), an insulated gate bipolar transistor (IGBT), or a thyristor.

In various embodiments, the first semiconductor chip 70 may comprise power chips, which, for example, draw large currents (e.g., greater than 30 amperes). In various embodiments, the first semiconductor chip 70 is configured to operate at about 20 V to about 1000 V. In one embodiment, the first semiconductor chip 70 is configured to operate at about 20 V to about 100 V. In one embodiment, the first semiconductor chip 70 is configured to operate at about 100 V to about 500 V. In one embodiment, the first semiconductor chip 70 is configured to operate at about 500 V to about 1000 V. In various embodiments, the first semiconductor chip 70 is configured to operate at about 10 V to about 10,000 V.

In one embodiment, the first semiconductor chip 70 is an n-channel MISFET. In another embodiment, the first semiconductor chip 70 is a p-channel MISFET. In one or more embodiments, the first semiconductor chip 70 may comprise a plurality of devices such as a vertical MISFET and a diode, or alternatively two MISFET devices separated by an isolation region.

The thickness of the first semiconductor chip 70 from the first side 61 to the second side 62 may be less than 150 μm in various embodiments. The thickness of the first semiconductor chip 70 from the first side 61 to the second side 62 may be less than 100 μm in various embodiments. The thickness of the first semiconductor chip 70 from the first side 61 to the second side 62 may be less than 50 μm in various embodiments. The thickness of the first semiconductor chip 70 from the first side 61 to the second side 62 may be about 50 μm to about 150 μm in various embodiments. The thickness of the first semiconductor chip 70 from the first side 61 to the second side 62 may be about 100 μm to about 150 μm in one embodiment. The thickness of the first semiconductor chip 70 from the first side 61 to the second side 62 may be about 50 μm to about 100 μm in one embodiment.

Referring to FIG. 2C, the first semiconductor chip 70 is disposed over a die paddle of a leadframe 60. The second side 62 of the first semiconductor chip 70 includes a first contact region 71, a second contact region 72, and a third contact region 73. In one or more embodiments, the first contact region 71 and the third contact region 73 are coupled to a same region so as to form alternate contacts to the first semiconductor chip 70. For example, in one embodiment, the first contact region 71 and the third contact region 73 are both coupled to a same source region of a field effect transistor. In another embodiment, the first contact region 71 and the third contact region 73 are both coupled to a same emitter region of a transistor. In one or more embodiments, the second contact region 72 is coupled to a gate of a transistor. In alternative embodiments, the second contact region 72 is coupled to a base of a transistor.

A first interconnect 91 couples the second contact region 72, which is coupled to a gate/base region, to a first gate/base lead 51. A second interconnect 92 couples the third contact region 73, which is coupled to a source/emitter region, to a first source/emitter lead 53. Because of the larger currents drawn through the first source/emitter lead 53, the second interconnect 92 may comprise a thicker wire relative to the first interconnect 91 in some embodiments. A first drain/collector lead 52 is coupled to the first semiconductor chip 70 through the die paddle of the leadframe 60. Thus, in one embodiment, the semiconductor device 10 has the first gate/base lead 51, the first drain/collector lead 52, followed by the first source/emitter lead 53.

FIG. 2D illustrates a magnified cross-sectional view of the switching element 110 disposed under the leadframe 60. In one or more embodiments, the switching element 110 may comprise a diode. In one embodiment, the switching element 110 comprises a semiconductor diode having a first conductivity type region 111 and a second conductivity type region 112. The first conductivity type region 111 and the second conductivity type region 112 have opposite net doping so as to form a p/n junction.

FIG. 3, which includes FIGS. 3A-3D, illustrates schematics of electrical equivalent circuit diagram of semiconductor devices in accordance with embodiments of the invention.

Embodiments of the invention may be applied to any type of semiconductor devices. As example, embodiments of the invention may be applied to power devices, e.g., having vertical current flow. Due to the large currents flowing through these devices, they generate large amounts of heat that need to be removed quickly to avoid heat buildup, which can impact the performance of these devices negatively.

Figure 3A:
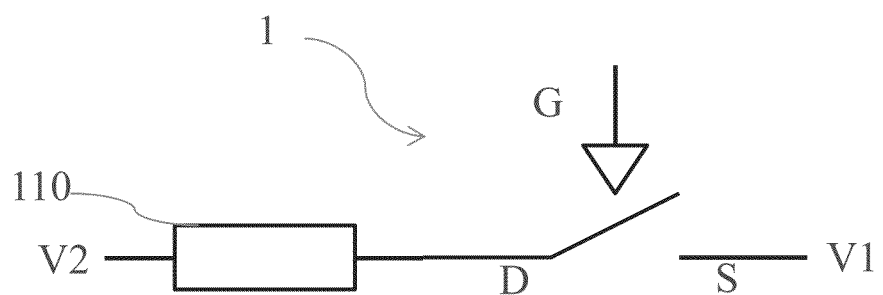
FIGS. 3A-3D, illustrates schematics of electrical equivalent circuit diagram of semiconductor devices in accordance with embodiments of the invention.

FIG. 3A illustrates an embodiment of the invention in which a switching element 110 is attached to a transistor 1. The transistor 1 has a control node G, a drain node D, and a source node S, which is coupled to a first potential node V1. As illustrated in one embodiment, the switching element 110 is attached in series with the transistor 1. A first node of the switching element 110 is coupled to the drain node D while a second node of the switching element 110 is coupled to an external potential node (second voltage node V2). During operation, a potential difference is maintained across the second node of the switching element 110 and the source node S of the transistor 1.

In the ON state, the gate node is pulled up (assuming an n-channel transistor), which renders the transistor 1 conducting. As the transistor 1 begins to conduct, most of the potential difference between the first voltage node V1 and the second voltage node V2 is applied across the switching element 110, which switches ON the switching element 110. Thus, when the heat is building up within the transistor 1 (due to being in the ON state), the switching element 110 becomes electrically conductive, which removes the thermal energy from the transistor 1.

In one or more embodiments, the switching element 110 is configured to conduct when a positive potential difference above a threshold voltage is applied. In alternative embodiments, the switching element 110 is configured to conduct when a potential difference below a threshold voltage is applied. In one embodiment, the switching element 110 is a diode, which has low resistance to current flow in one direction while having a large resistance in the opposite direction. Advantageously, the current conduction also removes thermal energy from the transistor 1 thereby cooling the transistor 1.

In the OFF state, the gate node is on low, which shuts OFF the transistor 1. Thus, the potential difference between the first potential node V1 and the second potential node V2 is dropped mostly across the transistor 1. As the potential difference across the first and the second terminals of the switching element 110 is below a threshold voltage, the switching element 110 stops to conduct current or stays in the OFF state. Thus, in contrast to ON state, the switching element 110 behaves as an isolation element in the OFF state, which therefore isolates the heatsink from the transistor 1. Thus, the switching element 110 behaves as an electro-thermal switch turning ON electrically and thermally (as a heat extractor) when the transistor 1 is in the ON state and turning OFF electrically and thermally when the transistor 1 is in the OFF state.

Figure 3B:
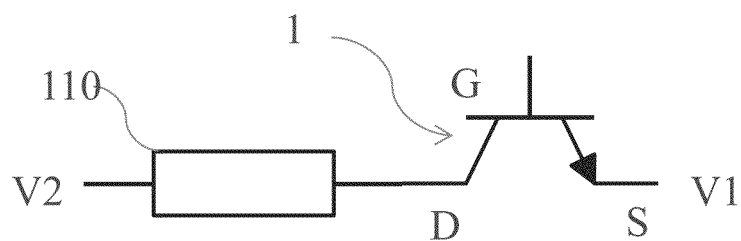
Figure 3C:
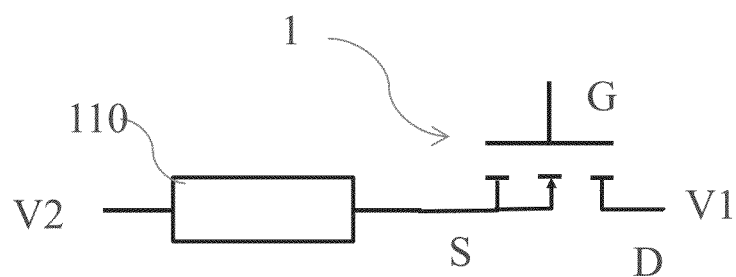

In various embodiments, the transistor 1 may comprise power metal insulator semiconductor field effect transistors (MISFETs) or power insulated gate bipolar transistors (IGBTs). FIG. 3B illustrates an electrical equivalent circuit diagram of a power MISFET while FIG. 3C illustrates a power IGBT in accordance with embodiments of the invention.

Such power MISFETs or power IGBTs may have varying dielectric strengths depending on the respective embodiment. For example, the dielectric strengths may vary from a few 10 V up to a few 100V. The dielectric strength is a maximum voltage across the source node to the drain node (the load path) that the transistor 1 is able to withstand without breakdown in the OFF state. Power MISFETs and power IGBTs may be n-conducting and p-conducting transistors in various embodiments although FIGS. 3B and 3C use circuit symbols for n-conducting transistors.

Figure 3D:
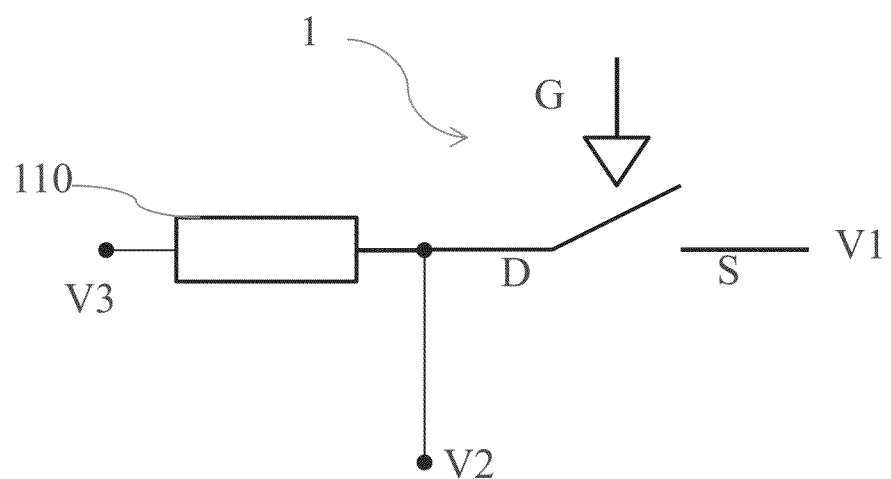

In another embodiment as illustrated in FIG. 3D, the switching element 110 may be attached differently. As illustrated, a first terminal of the switching element 110 is attached to a drain of the transistor 1, which is coupled to a second potential node V2. The second terminal of the switching element 110 is coupled to a third potential node V3.

Figure 4A:
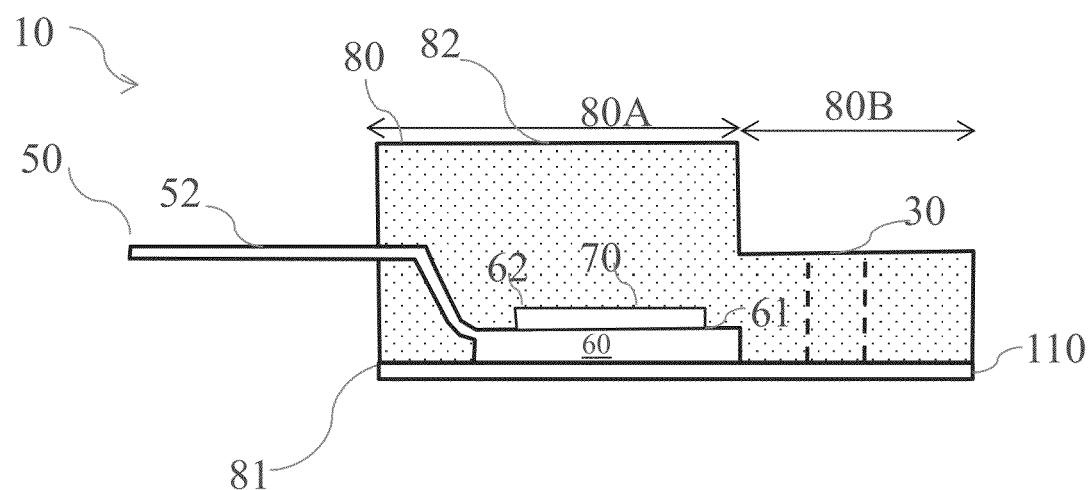
FIGS. 4A and 4B, illustrates cross-sectional views of the semiconductor device in accordance with embodiments of the invention.
Figure 4B:
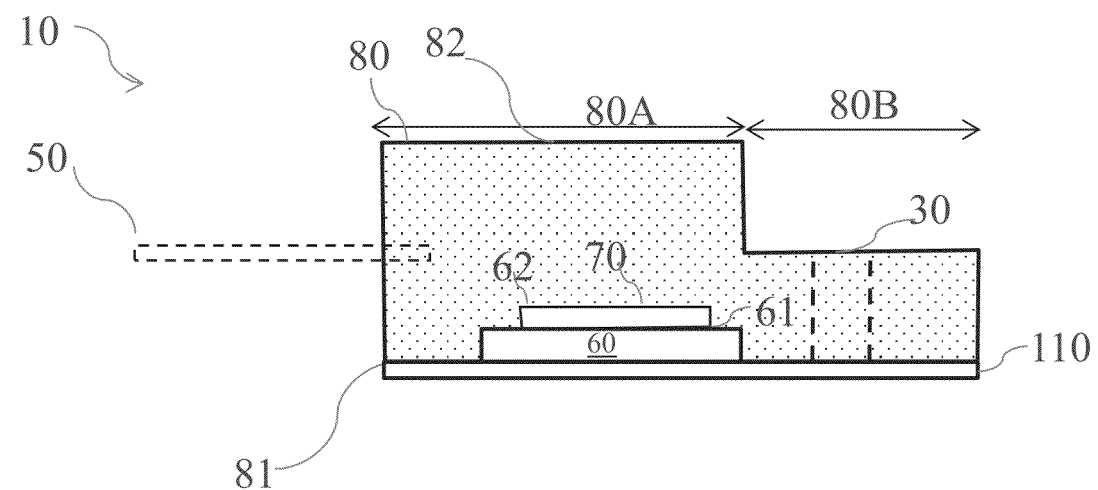

FIG. 4, which includes FIGS. 4A and 4B, illustrates cross-sectional views of the semiconductor device in accordance with embodiments of the invention.

Referring to FIG. 4A, the switching element 110 may be formed under the first major surface 81 of the encapsulant 80. In one or more embodiments, the switching element 110 may be attached to the leadframe using a suitable conductive layer such as a conductive paste, solder, and others. Examples of the conductive paste may include metallic nano-paste, for example, comprising silver. In various embodiments, the adhesive conductive layer is applied uniformly over the entire exposed surface of the leadframe 60 to ensure good thermal conduction.

FIG. 4B illustrates an alternative embodiment in which the leadframe 60 is not directly coupled to the plurality of leads 50. Rather as described in FIG. 3A, in some embodiments, the first semiconductor chip 70 is coupled to an external voltage through the switching element 110.

Figure 5A:
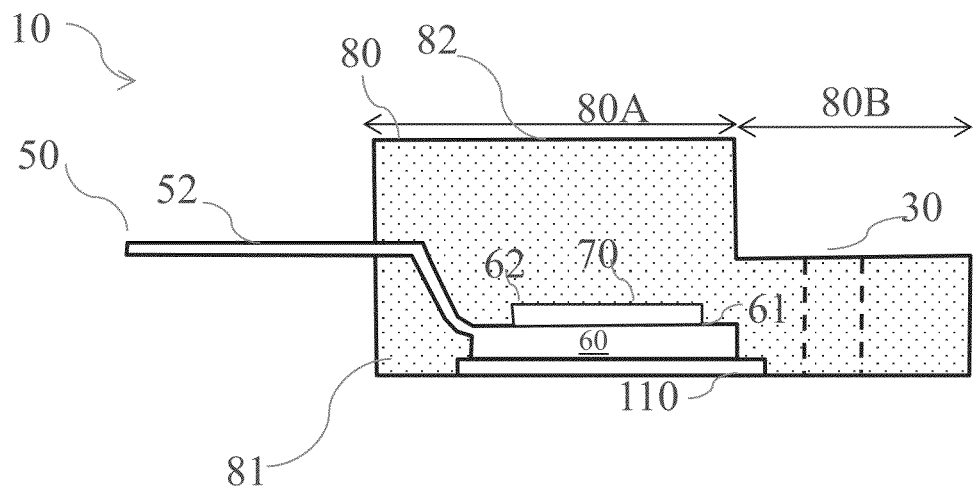
FIGS. 5A and 5B, illustrates cross-sectional views of the semiconductor device in which the switching element is disposed within the encapsulant in accordance with embodiments of the invention.
Figure 5B:
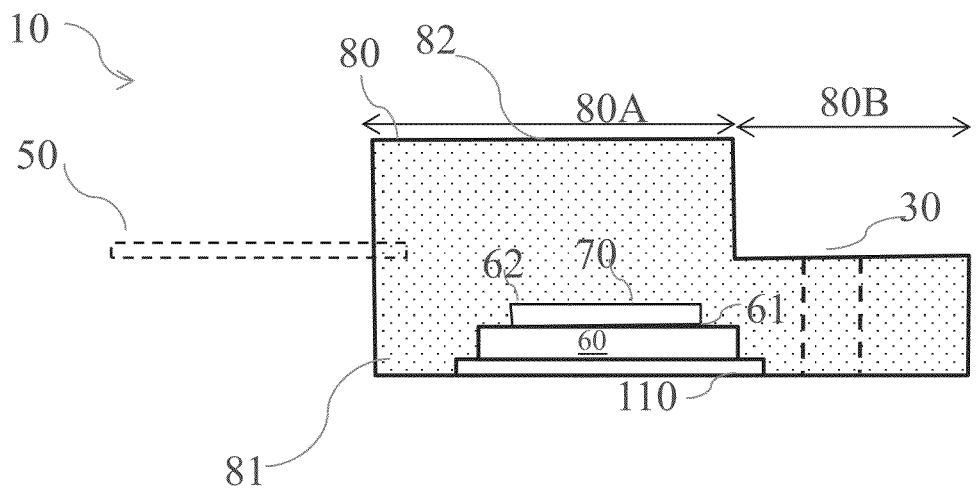

FIG. 5, which includes FIGS. 5A and 5B, illustrates cross-sectional views of the semiconductor device in which the switching element is disposed within the encapsulant in accordance with embodiments of the invention.

FIGS. 5A and 5B illustrate embodiments in which the switching element 110 covers the exposed bottom surface of the leadframe 60 but does not extend completely under the first major surface 81. Accordingly, in this embodiment, the switching element 110 is disposed within the encapsulant 80.

Figure 6A:
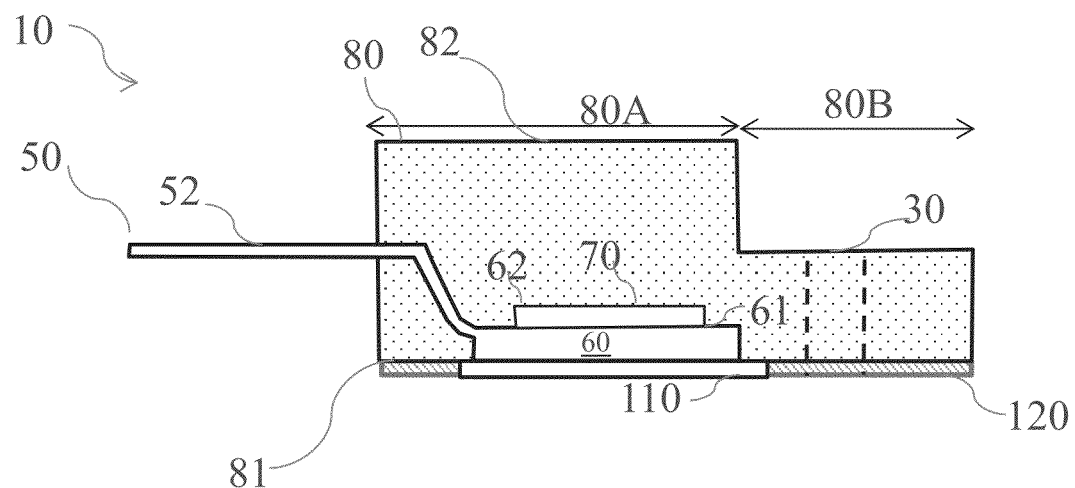
FIGS. 6A and 6B, illustrates cross-sectional views of the semiconductor device in which the switching element is disposed within an auxiliary insulating layer in accordance with embodiments of the invention.
Figure 6B:
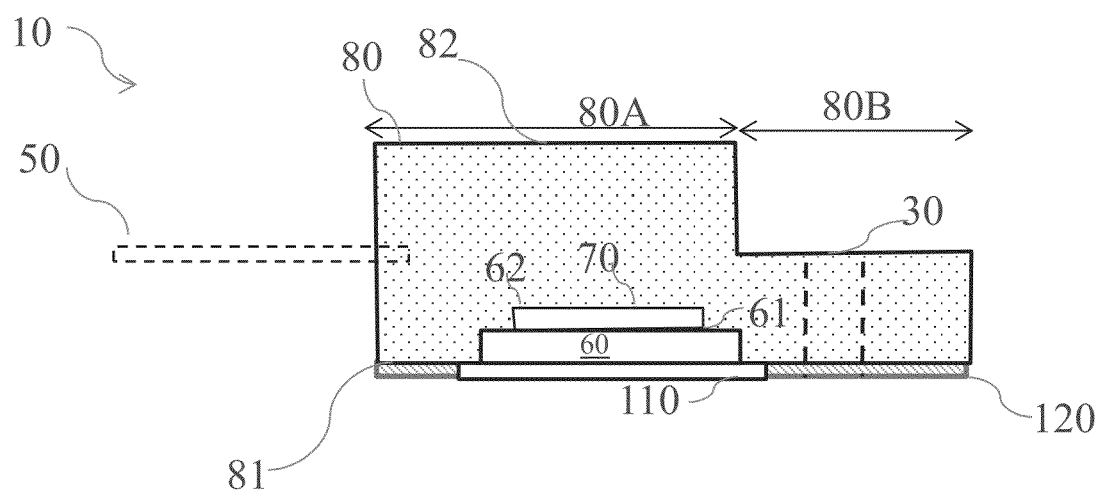

FIG. 6, which includes FIGS. 6A and 6B, illustrates cross-sectional views of the semiconductor device in which the switching element is disposed within an auxiliary insulating layer in accordance with embodiments of the invention.

FIGS. 6A and 6B illustrate alternative embodiments in which the switching element 110 is disposed within an insulating layer 120. The insulating layer 120 may be formed after forming the encapsulant 80 in various embodiments. In various embodiments, the insulating layer 120 may comprise a suitable dielectric material such as an oxide, nitride, or an encapsulant material.

Figure 7A:
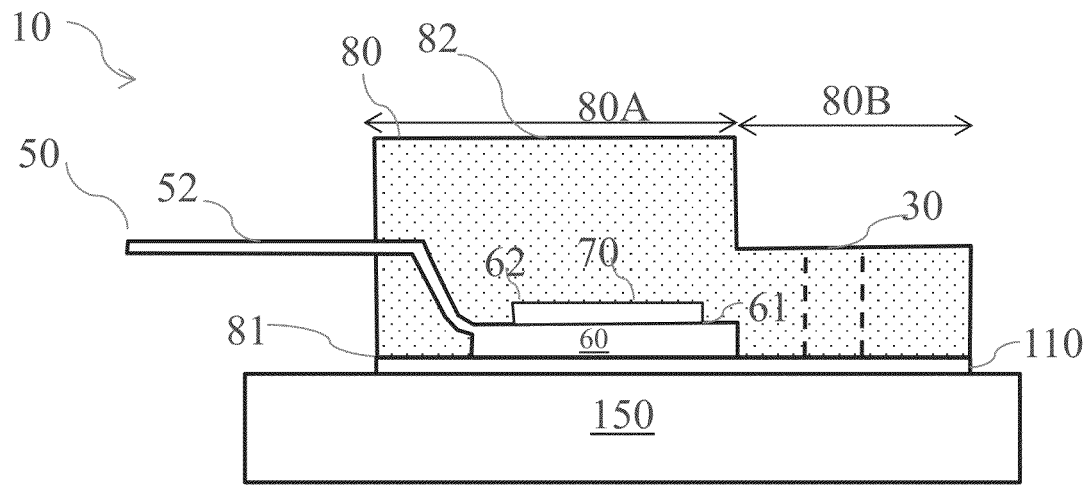
FIGS. 7A and 7B, illustrates cross-sectional views of the semiconductor device in which the switching element is disposed between a heatsink and the leadframe in accordance with embodiments of the invention.
Figure 7B:
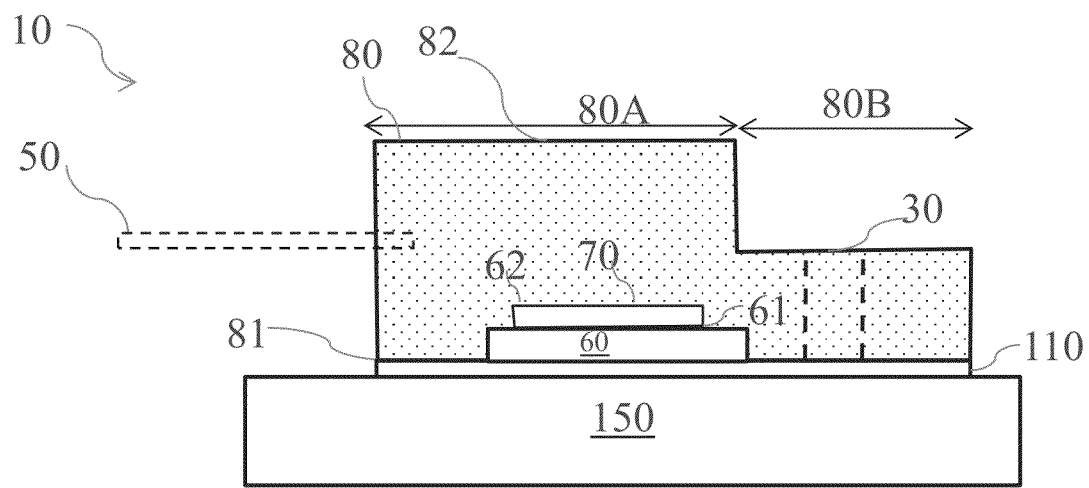

FIG. 7, which includes FIGS. 7A and 7B, illustrates cross-sectional views of the semiconductor device in which the switching element is disposed between a heatsink and the leadframe in accordance with embodiments of the invention.

FIGS. 7A and 7B illustrate embodiments of the invention in which a heatsink 150 is attached to the semiconductor device 10. The heatsink 150 may be attached to the semiconductor device 10, for example, using mounting screws through the opening 30.

Figure 8A:
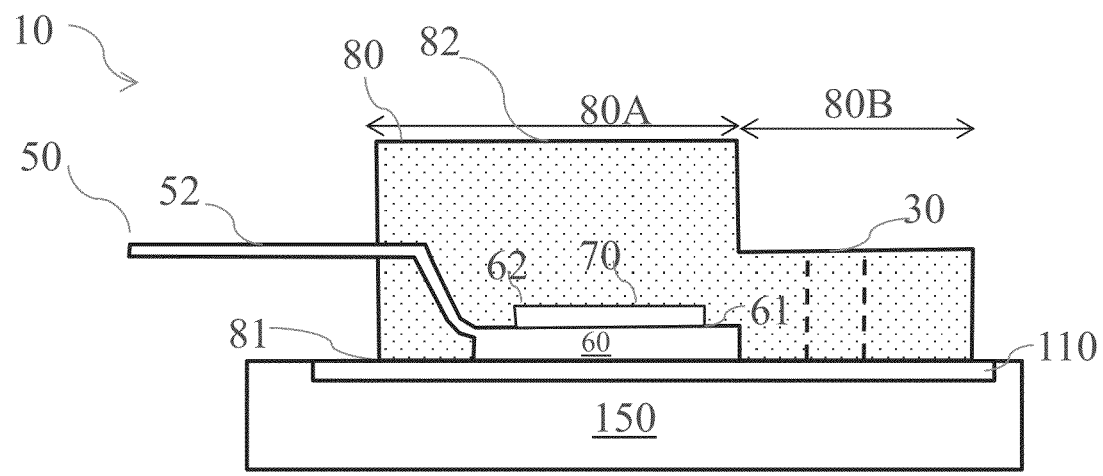
FIGS. 8A and 8B, illustrates cross-sectional views of the semiconductor device in which the switching element is disposed within the heatsink in accordance with embodiments of the invention.
Figure 8B:
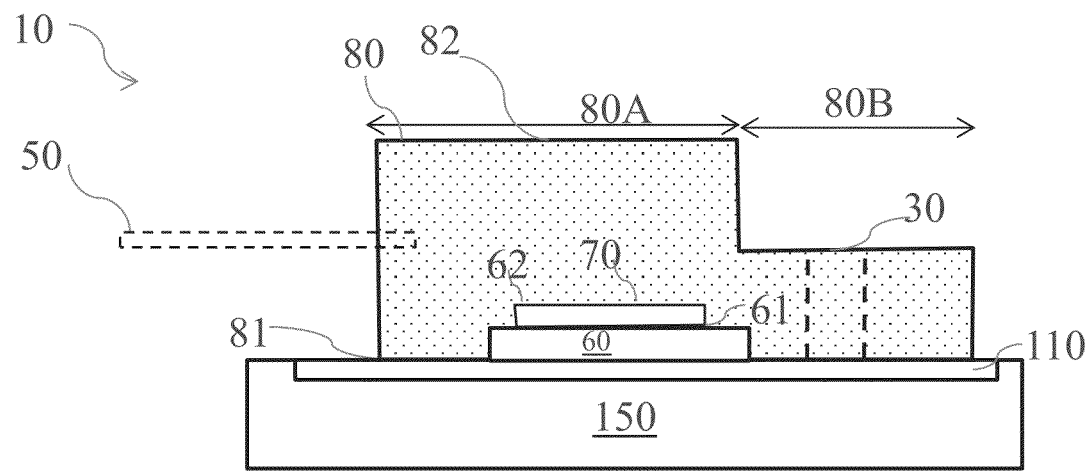

FIG. 8, which includes FIGS. 8A and 8B, illustrates cross-sectional views of the semiconductor device in which the switching element is disposed within the heatsink in accordance with embodiments of the invention.

FIGS. 8A and 8B illustrate embodiments of the invention in which the switching element 110 is formed within the heatsink 150. For example, the switching element 110 may be a part of a heatsink 150. In one or more embodiments, the switching element 110 may be formed on a portion of a top surface of the heatsink 150. In alternative embodiments, the switching element 110 may be formed on an entire top surface of the heatsink 150.

Figure 9:
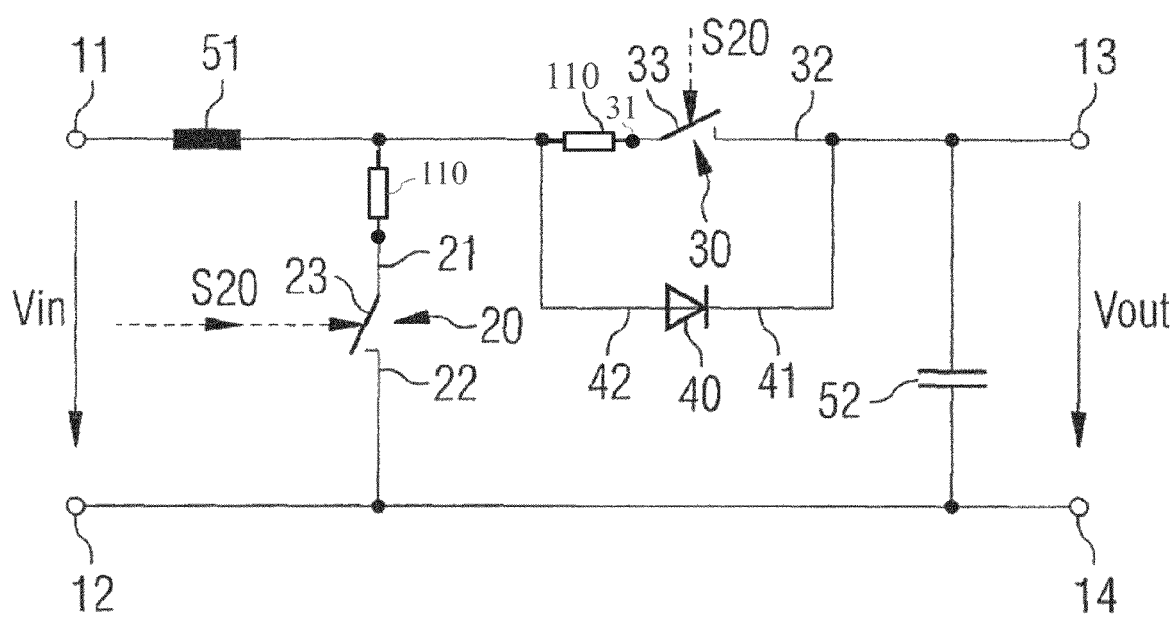
FIG. 9 illustrates a schematic circuit using embodiments of the invention.

FIG. 9 illustrates a schematic circuit using embodiments of the invention.

Embodiments of the invention may be used to form various types of circuits. Examples of such circuits include driver circuits such as half bridge circuits and others used in regulating power including conversion circuits. As but one example, a converter is illustrated using the switching element described in various embodiments.

Referring to FIG. 9, a converter is formed as a boost converter and includes a first semiconductor switching element 20, a second semiconductor switching element 30, a rectifier element 40 connected in parallel with the second semiconductor switching element 30, an inductive storage element 51, and a capacitive storage element 52. The converter has a first input terminal 11 and a second input terminal 12 for applying an input voltage Vin and a first output terminal 13 and a second output terminal 14 for providing an output voltage Vout. A load may be connected between the first and the second output terminals 13 and 14.

Each of the first semiconductor switching element 20 and the second semiconductor switching element 30 respectively have a first load path connection 21, 31 and a second load path connection 22, 32 and a control connection 23, 33. A load path of the respective first and the second switching element 20 and 30 runs between the load path connections 21, 31 and 22, 32, respectively. In n-conducting or n-channel devices, the first load path connections 21, 31 are drain connections and the second load path connections 22, 32 are source connections. In p-conducting or p-channel devices, the first load path connections 21, 31 are source connections and the second load path connections 22, 32 are drain connections.

The rectifier element 40 has a first load path connection 41 and a second load path connection 42, between which a load path is formed. The load paths of the second semiconductor switching element 30 and of the rectifier element 40 are connected in parallel with one another.

The first and the second semiconductor switching elements 20, 30 may be driven to the ON state and to the OFF state according to drive signals S20, S30, which are fed to the control connections 23, 33 of the first and the second semiconductor switching elements 20, 30.

The input voltage Vin is less than the output voltage Vout for a boost converter as illustrated in this example. The first semiconductor switching element 20 controls a current by the inductive storage element 51. For this purpose, the first semiconductor switching element 20 is connected in series with the inductive storage element 51 between the first input terminal 11 and the second input terminal 12. A series circuit including the second semiconductor switching element 30 and the capacitive storage element 52 is connected in parallel with the first semiconductor switching element 20. The rectifier element 40 is connected with polarity such that it permits a current flow from the inductive storage element 51 to the capacitive storage element 52, but prevents such a current flow in the opposite direction.

As illustrated further in FIG. 9, the first semiconductor switching element 20 and the second semiconductor switching element 30 are coupled through corresponding a switching element 110 as discussed in various embodiments above.

FIG. 10, which includes FIGS. 10A-10D, illustrates a semiconductor device during various stages of fabrication in accordance with an embodiment of the invention.

Figure 10A:
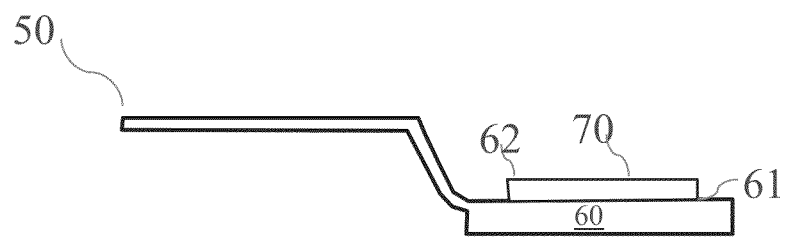
FIGS. 10A-10D, illustrates a semiconductor device during various stages of fabrication in accordance with an embodiment of the invention.
Figure 10B:
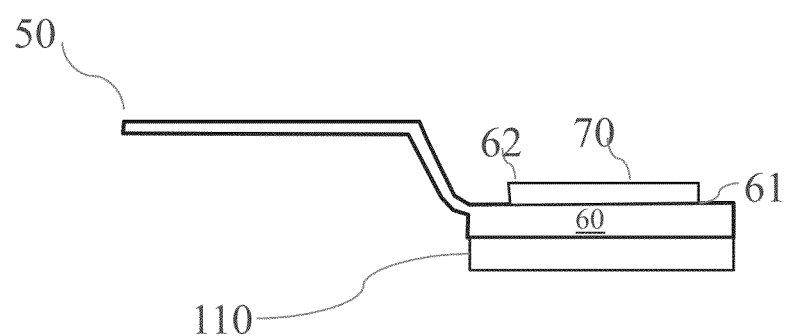

Referring to FIG. 10A, a first semiconductor chip 70 is attached to a leadframe 60 having a plurality of leads 50. As next illustrated in FIG. 10B, the switching element 110 is attached to the back side of the leadframe 60. In one or more embodiments, the switching element 110 may be a semiconductor chip fabricated separately using a semiconductor wafer. However, in some embodiments, the switching element 110 may be directly deposited over the back side of the leadframe 60. As described previously, the switching element 110 may be a semiconductor material such as silicon, silicon germanium, silicon carbon, gallium nitride, and other materials. Alternatively, the switching element 110 may be formed using organic semiconductor materials. In some embodiments, the switching element 110 may also be formed using carbon such as carbon nanotubes, graphene, and others. The switching element 110 may be attached using any technique but ensures good thermal contact in various embodiments. For example, a conductive layer/paste may be used in one or more embodiments.

Figure 10C:
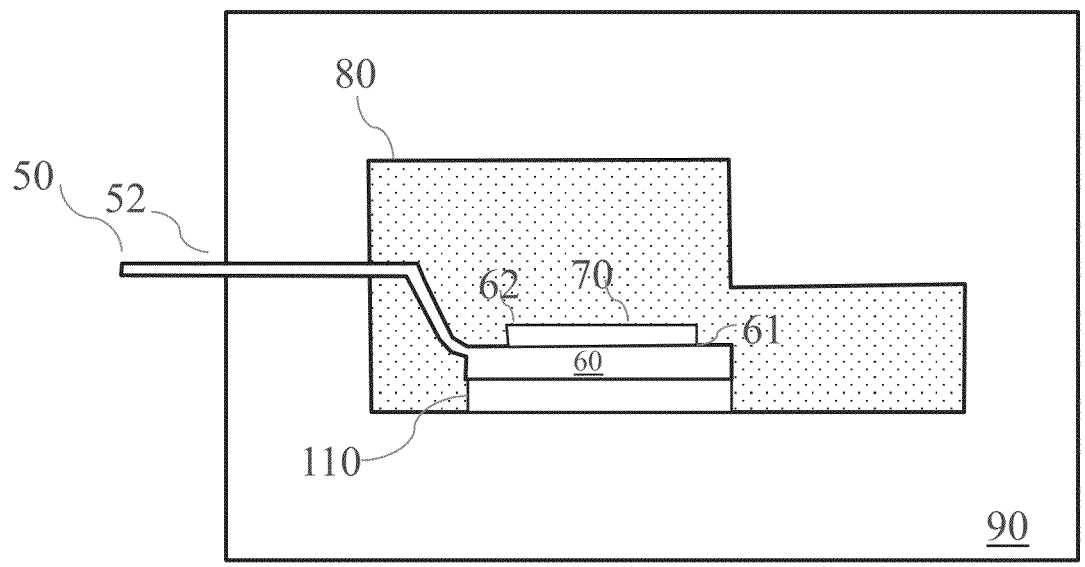

Referring next to FIG. 10C, after forming interconnects (e.g., wire bonds, clips, ribbons, strips, and others), the leadframe 60 with the first semiconductor chip 70 and the switching element 75 may be placed within a mold cavity of a molding tool 90.

In one or more embodiments, the encapsulating material is applied using a compression molding process. In compression molding, the encapsulating material may be placed into a molding cavity, then the molding cavity is closed to compress the encapsulating material. Compression molding may be used when a single pattern is being molded.

As illustrated in FIG. 10C, the leadframe 60 with the first semiconductor chip 70 is placed within a molding tool 90 having a mold cavity. The encapsulating material may be introduced into the molding tool 90, which may compress the encapsulant material in one embodiment.

In an alternative embodiment, the encapsulating material is applied using a transfer molding process. In other embodiments, the encapsulating material may be applied using injection molding, granulate molding, powder molding, or liquid molding. Alternatively, the encapsulating material may be applied using printing processes such as stencil or screen printing.

In various embodiments, the encapsulating material comprises a dielectric material and may comprise a mold compound in one embodiment. In other embodiments, the encapsulating material may comprise a polymer, a biopolymer, a fiber impregnated polymer (e.g., carbon or glass fibers in a resin), a particle filled polymer, and other organic materials. In one or more embodiments, the encapsulating material comprises a sealant not formed using a mold compound, and materials such as epoxy resins and/or silicones. In various embodiments, the encapsulating material may be made of any appropriate duroplastic, thermoplastic, or thermosetting material, or a laminate. The material of the encapsulating material may include filler materials in some embodiments. In one embodiment, the encapsulating material may comprise epoxy material and a fill material comprising small particles of glass or other electrically insulating mineral filler materials like alumina or organic fill materials.

Figure 10D:
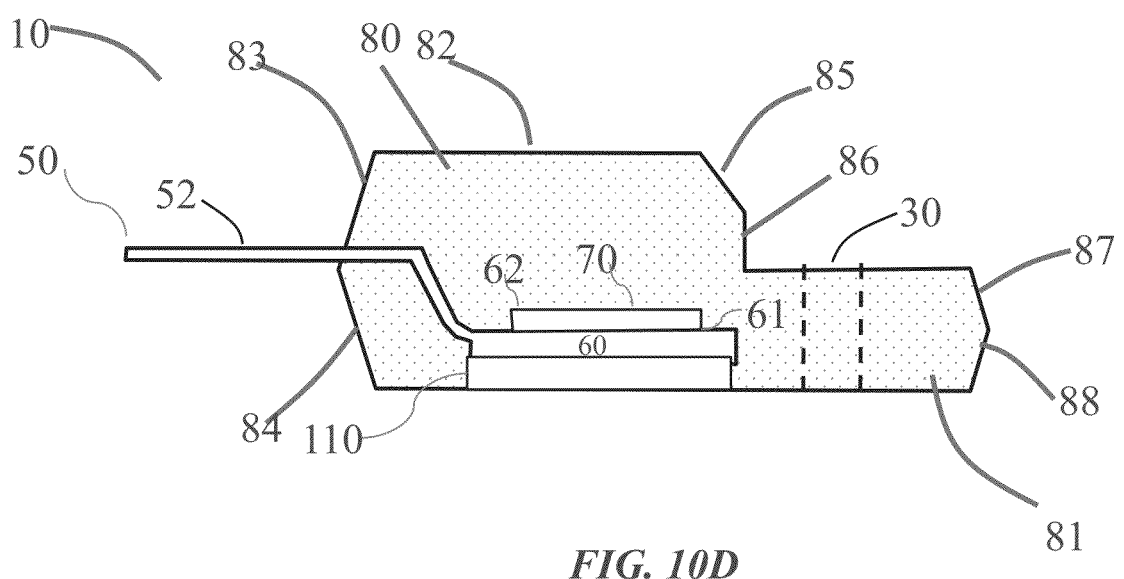

The leadframe 60 is removed from the molding tool 90 and cured to form the encapsulant 80 as illustrated in FIG. 10D. The encapsulating material deposited previously may be cured, i.e., subjected to a thermal process to harden so as to form a hermetic seal protecting the semiconductor chip. The curing process hardens the encapsulating material thereby forming a single substrate comprising an encapsulant 80 holding the leadframe 60 and the first semiconductor chip 70.

In some embodiments, the packaging may be performed using a batch process in which a plurality of first semiconductor chips 70 are simultaneously packaged over a common leadframe 60 and formed within an encapsulant 80. Thus, a plurality of packages are formed which may be singulated to form a plurality of individual semiconductor devices 10.

Figure 11A:
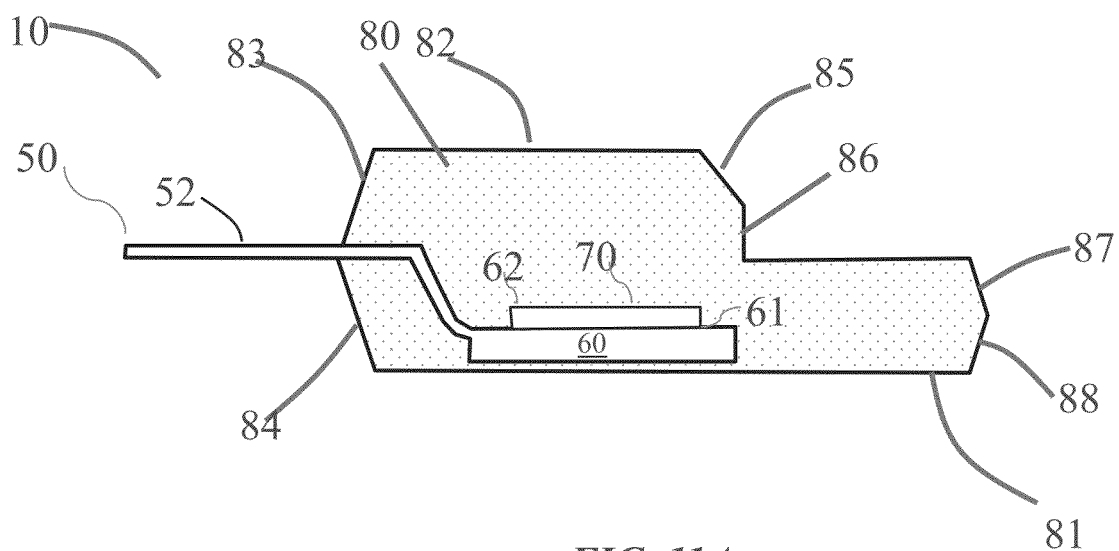
FIGS. 11A-11C, illustrates a semiconductor device during various stages of fabrication in accordance with an embodiment of the invention.
Figure 11B:
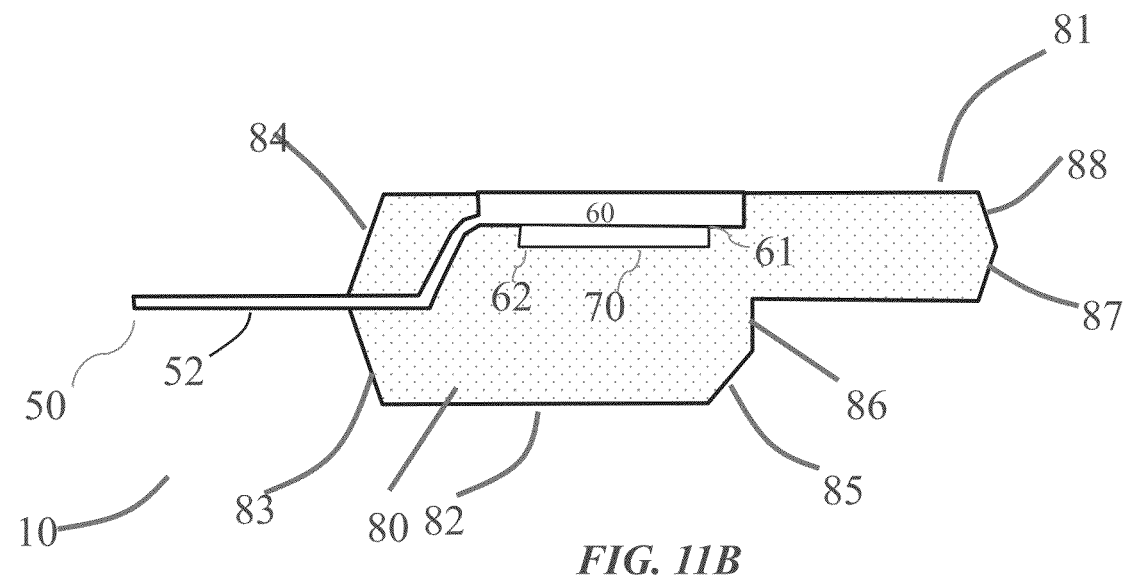
Figure 11C:
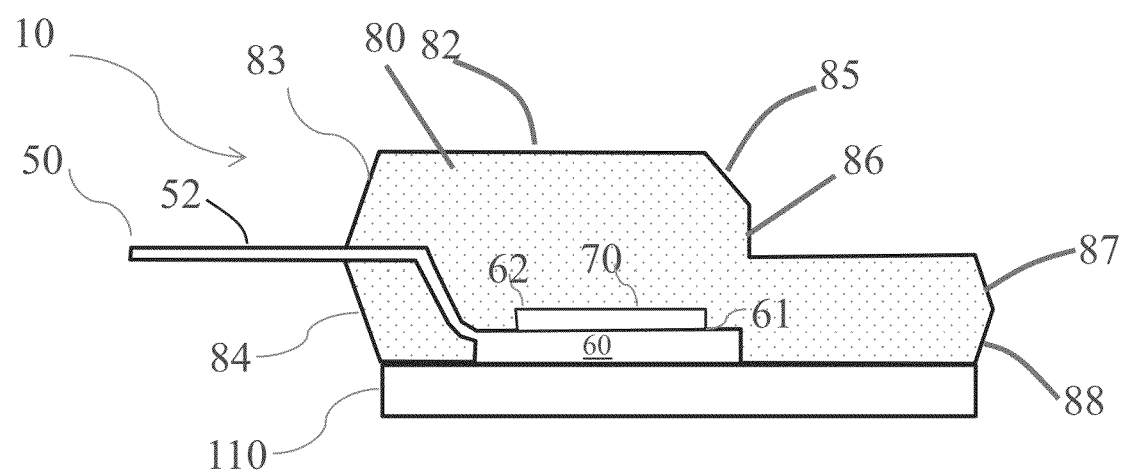

FIG. 11, which includes FIGS. 11A-11C, illustrates a semiconductor device during various stages of fabrication in accordance with an embodiment of the invention.

Unlike the previous embodiment illustrated in FIG. 10, in this embodiment the semiconductor device 10 is fabricated using conventional processes. After forming the semiconductor device 10, the leadframe 60 is covered with a thin portion of the encapsulant 80 as illustrated in FIG. 11A.

Referring to FIG. 11B, the semiconductor device 10 is thinned from the back side so as to remove the thin portion of the encapsulant 80. In one or more embodiments, the thinning may be performed chemically, mechanically, or chemical-mechanically.

The switching element 110 is formed on the exposed leadframe 60 as illustrated in FIG. 11C. For example, the switching element 110 may be formed separately and may be attached to the exposed surface of the semiconductor device 10.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIG. 2 may be combined with the embodiments described in FIGS. 4-9. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor module comprising:
a leadframe having a first side and an opposite second side;
a semiconductor chip disposed over the first side of the leadframe; and
a switching element disposed under the second side of the leadframe, wherein the switching element has a first surface facing the leadframe and an opposite second surface for mounting a heatsink, wherein the switching element is configured to electrically isolate the semiconductor chip from the heatsink when the semiconductor chip is active and electrically couple the semiconductor chip with the heatsink when the semiconductor chip is not active.

2. The semiconductor module according to claim 1, wherein the semiconductor chip comprises a contact region coupled to an external potential node through a lead of the leadframe.

3. The semiconductor module according to claim 1, wherein the semiconductor chip comprises a contact region coupled to an external potential node through the switching element.

4. The semiconductor module according to claim 1, wherein the switching element comprises a diode.

5. The semiconductor module according to claim 4, wherein the diode comprises a semiconductor diode.

6. The semiconductor module according to claim 5, wherein the semiconductor diode comprises silicon.

7. The semiconductor module according to claim 4, wherein the diode comprises a carbon based semiconductor.

8. The semiconductor module according to claim 1, further comprising an encapsulant disposed at the leadframe.

9. The semiconductor module according to claim 8, wherein the switching element is disposed within the encapsulant.

10. The semiconductor module according to claim 1, wherein the leadframe comprises a die paddle over which the semiconductor chip is disposed, wherein the die paddle has a first footprint and the switching element has a second footprint, wherein the first footprint is about the same as the second footprint.

11. The semiconductor module according to claim 1, further comprising a heatsink disposed under the switching element.

12. The semiconductor module according to claim 11, wherein the switching element is disposed within the heatsink.

13. The semiconductor module according to claim 12, wherein the semiconductor chip comprises a source/emitter region and a drain/collector region, wherein the drain/collector region is electrically coupled to a first terminal of the switching element, and wherein a second terminal of the switching element is electrically coupled to the heatsink.

14. A semiconductor module comprising:
a first discrete semiconductor device including a first lead and a second lead; and
a first switching element having a first terminal and a second terminal, the first terminal of the first switching element electrically and thermally coupled to the first discrete semiconductor device, the first switching element configured to conduct heat away from the first discrete semiconductor device, wherein the first switching element is configured to electrically isolate the first discrete semiconductor device from a heatsink disposed below the first switching element when the first discrete semiconductor device is not active, wherein the first switching element is configured to electrically and thermally couple the first discrete semiconductor device to the heatsink when the first discrete semiconductor device is active.

15. The semiconductor module according to claim 14, wherein the first lead is a source/emitter lead, and wherein the second lead is a drain/collector lead.

16. The semiconductor module according to claim 14, wherein the first switching element comprises a discrete diode.

17. The semiconductor module according to claim 14, further comprising a second discrete semiconductor device including a third lead and a fourth lead, the second lead and the fourth lead being coupled to a first potential node, wherein the second lead is coupled to the first potential node through the first switching element.

18. The semiconductor module according to claim 17, wherein the first lead is a first source/emitter lead, wherein the second lead is a first drain/collector lead, wherein the third lead is second source/emitter lead, and wherein the fourth lead is a second drain/collector lead.

19. The semiconductor module according to claim 17, further comprising a second switching element having a first terminal and a second terminal, the first terminal of the second switching element being coupled to the fourth lead.

20. The semiconductor module according to claim 17, wherein the first discrete semiconductor device comprises a discrete insulated gate bipolar transistor, and wherein the second discrete semiconductor device also comprises a discrete insulated gate bipolar transistor.

21. The semiconductor module according to claim 17, wherein the first discrete semiconductor device comprises a discrete metal insulator field effect transistor, and wherein the second discrete semiconductor device also comprises a discrete metal insulator field effect transistor.

22. A method of forming a semiconductor module, the method comprising:
providing a semiconductor device comprising a leadframe having a first side and an opposite second side and a semiconductor chip disposed over the first side of the leadframe; and
attaching a switching element at the second side of the leadframe, wherein the switching element has a first surface facing the leadframe and an opposite second surface for mounting a heatsink, wherein the switching element is configured to electrically isolate the semiconductor chip from the heatsink when the semiconductor chip is active and electrically couple the semiconductor chip with the heatsink when the semiconductor chip is not active.

23. The method according to claim 22, wherein the switching element comprises a semiconductor diode.

24. The method according to claim 22, wherein attaching the switching element comprises attaching a semiconductor diode under the second side of the leadframe.

25. The method according to claim 22, wherein attaching the switching element comprises forming a carbon based material under the second side of the leadframe.

26. The method according to claim 22, further comprising attaching a heatsink to the switching element.

27. The method according to claim 22, wherein attaching the switching element comprises attaching a heatsink, and wherein the switching element is disposed within the heatsink.

28. A semiconductor module comprising:
a discrete vertical transistor including a first transistor terminal and a second transistor terminal;

a discrete diode having a first terminal and a second terminal; and a die paddle having a first side and an opposite second side, wherein the discrete vertical transistor is mounted on the first side of the die paddle, and wherein the discrete diode is mounted on the second side of the die paddle, wherein the first transistor terminal is electrically and thermally coupled to the first terminal through the die paddle, wherein the discrete diode is configured to be in an ON state when the discrete vertical transistor is operating at an ON state and the discrete diode is configured to be in an OFF state when the discrete vertical transistor is operating at an OFF state.

29. The semiconductor module according to claim 28, further comprising:

an encapsulant disposed over the discrete vertical transistor and the die paddle; and an insulating layer disposed over the encapsulant, wherein the discrete diode is disposed within the insulating layer.

30. The semiconductor module according to claim 28, further comprising:

an encapsulant disposed over the discrete vertical transistor, the discrete diode, and the die paddle, wherein the discrete diode is disposed within the encapsulant, wherein the die paddle has a first footprint and the discrete diode has a second footprint, wherein the first footprint is less than the second footprint.

* * * * *